United States Patent
Kim et al.

(10) Patent No.: US 9,012,884 B2
(45) Date of Patent: Apr. 21, 2015

(54) SEMICONDUCTOR LIGHT-EMITTING DEVICES INCLUDING CONTACT LAYERS TO FORM REFLECTIVE ELECTRODES

(71) Applicant: Samsung Electronics Co., Ltd., Suwon-si, Gyeonggi-do (KR)

(72) Inventors: Jung-Sub Kim, Hwaseong-si (KR); Sung-Won Hwang, Hwaseong-si (KR); Geun-Woo Ko, Suwon-si (KR); Cheol-Soo Sone, Seoul (KR); Sung-Hyun Sim, Seoul (KR); Jin-Sub Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 51 days.

(21) Appl. No.: 13/828,346

(22) Filed: Mar. 14, 2013

(65) Prior Publication Data

US 2014/0008608 A1    Jan. 9, 2014

(30) Foreign Application Priority Data

Jul. 5, 2012   (KR) .......................... 10-2012-0073489

(51) Int. Cl.
| | |
|---|---|
| *H01L 33/40* | (2010.01) |
| *H01L 33/30* | (2010.01) |
| *H01L 33/14* | (2010.01) |
| *H01L 33/32* | (2010.01) |
| *H01L 33/00* | (2010.01) |

(52) U.S. Cl.
CPC .............. *H01L 33/405* (2013.01); *H01L 33/305* (2013.01); *H01L 33/145* (2013.01); *H01L 33/40* (2013.01); *H01L 33/32* (2013.01); *H01L 33/0075* (2013.01); *H01L 33/14* (2013.01)

(58) Field of Classification Search
None
See application file for complete search history.

(56) References Cited

U.S. PATENT DOCUMENTS

| | | | |
|---|---|---|---|
| 7,872,272 B2 | 1/2011 | Bour et al. | |
| 2004/0195579 A1* | 10/2004 | Sonobe | 257/99 |
| 2005/0104080 A1* | 5/2005 | Ichihara et al. | 257/98 |
| 2006/0118820 A1* | 6/2006 | Gaska et al. | 257/189 |
| 2008/0296609 A1* | 12/2008 | Nagahama et al. | 257/103 |
| 2011/0008923 A1* | 1/2011 | Lin et al. | 438/46 |

FOREIGN PATENT DOCUMENTS

| | | |
|---|---|---|
| JP | 2004-006970 | 1/2004 |
| KR | 10-0631976 | 9/2006 |
| KR | 10-0730506 | 10/2006 |
| KR | 10-2010-0109629 | 10/2010 |

\* cited by examiner

*Primary Examiner* — Peniel M Gumedzoe
(74) *Attorney, Agent, or Firm* — McDermott Will & Emery LLP

(57) ABSTRACT

A semiconductor light-emitting device includes a contact layer. The contact layer has the composition ratio of Al elements which varies gradually therein. A region formed by an Al element in the contact layer of the semiconductor light-emitting device may improve light extraction efficiency of the light emitted from an active layer and facilitate a formation of the reflective electrode.

19 Claims, 3 Drawing Sheets

SEMICONDUCTOR LIGHT-EMITTING DEVICES INCLUDING CONTACT LAYERS TO FORM REFLECTIVE ELECTRODES

CROSS-REFERENCE TO RELATED PATENT APPLICATION

This application claims the benefit of priority to Korean Patent Application No. 10-2012-0073489, filed on Jul. 5, 2012, in the Korean Intellectual Property Office, the disclosure of which is incorporated herein in its entirety by reference.

TECHNICAL FIELD

The present disclosure relates to a nitride-based semiconductor light-emitting device, and more particularly, to a semiconductor light-emitting device including a contact layer in a structure that improves a formation of a highly reflective electrode and an efficiency of light reflection.

BACKGROUND

A nitride semiconductor light-emitting device includes a plurality of nitride semiconductor layers that are sequentially formed on a substrate. In particular, a nitride-based semiconductor using a nitride such as GaN is widely used for a photoelectric material and an electronic device due to the excellent characteristics thereof, and attracts much attention from those of ordinary skill in the art.

A typical nitride-based semiconductor light-emitting device has a multilayer structure including an n-type nitride semiconductor layer, an active layer, and a p-type nitride semiconductor layer that are formed on a substrate. The light generated from the active layer is emitted to the outside, and thus the active layer is used as a light source.

In order to obtain light having a wide range of wavelength from the nitride-based semiconductor light-emitting device, the nitride-based semiconductor that is composed of desired elements is used. In particular, in order to emit the light of the ultraviolet region having a wavelength of 320 nm or less, the active layer and the p-type semiconductor layer are formed of an AlGaN element. In the case of p-AlGaN, a hole concentration is theoretically very low, and it is not easy to form an ohmic contact with a metal electrode and to form a p-side electrode. In order to form the p-side electrode, an additional contact layer is formed between the p-type semiconductor layer and the electrode, but the absorption of the light emitted from the active layer saliently degrades efficiency of light extraction of the light emitting-device.

SUMMARY

The present disclosure provides a nitride-based semiconductor light-emitting device in a structure that facilitates a formation of a reflective electrode, and that improves efficiency of light extraction of the light emitted to the outside from an active layer.

An aspect of the present disclosure provides a semiconductor light-emitting device including a contact layer in a structure that facilitates a formation of a reflective electrode.

The semiconductor light-emitting device includes an n-type nitride semiconductor layer; an active layer disposed on the n-type nitride semiconductor layer; a p-type nitride semiconductor layer disposed on the active layer; a contact layer that is disposed on the p-type nitride semiconductor layer, and that includes a region of which a composition ratio of Al elements is variable in a thickness direction; and a reflective electrode disposed on the contact layer.

A thickness of the region in the contact layer of which a composition ratio of Al elements is variable may be greater than about 0 nm and smaller than about 50 nm.

The contact layer may have a relatively high composition ratio of Al elements at an interface region with the p-type nitride semiconductor layer and have a relatively low composition ratio of Al elements at an interface region with the reflective electrode.

The composition ratio of Al elements of the contact layer may be continuously or discontinuously variable.

The composition ratio of Al elements of the contact layer may be greater than about 0% and smaller than about 50%.

The region formed by Al elements in the contact layer may have a multilayer structure.

The region not formed by Al elements in the contact layer may have a total thickness of about 50 nm or less.

The reflective electrode may be formed of an Al-based material.

The Al-based material may be an Al element or an alloy thereof.

The alloy of Al elements may be formed of an Al element and a metal having a higher work function than Al elements.

The semiconductor light-emitting device may further include an electron blocking layer formed between the active layer and the p-type semiconductor layer.

The electron blocking layer may have the composition ratio of Al elements in a range of about 40% to about 100%.

The semiconductor light-emitting device may be an ultraviolet light-emitting device.

The semiconductor light-emitting device may be a flip-chip-type semiconductor light-emitting device.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION

Hereinafter, with reference to the figures, a semiconductor light-emitting device including a doped buffer layer, according to embodiments of the present inventive concept, will be described in detail. A thickness of layers or regions illustrated herein may be exaggerated for clarity of the present specification.

Figure 1A:
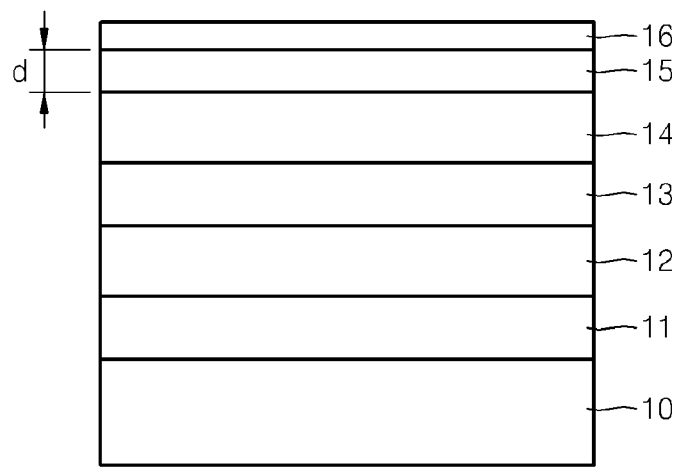
FIG. 1A is a view illustrating a semiconductor light-emitting device including a contact layer to form a reflective electrode, according to an embodiment of the present inventive concept.

FIG. 1A is a view illustrating a semiconductor light-emitting device including a contact layer to form a reflective electrode, according to an embodiment of the present inventive concept.

The semiconductor light-emitting device according to an embodiment of the present inventive concept may include a substrate 10, a buffer layer 11 formed on the substrate 10, and a multilayer of an n-type nitride semiconductor layer 12, an active layer 13, and a p-type nitride semiconductor layer 14 that are sequentially formed on the buffer layer 11. In addition, a contact layer 15 may be formed on the p-type nitride semiconductor layer 14, and a reflective electrode 16 may be formed on the contact layer 15.

Herein, the contact layer 15 that is introduced to form an ohmic contact with the reflective electrode 16 may facilitate formation of the reflective electrode 16 and include Al elements to minimize absorption of the light emitted from the active layer 13. Herein, the active layer 13 may include Al elements based on the entire or a particular region of the contact layer 15. When Al elements are included in the contact layer 15, a composition of the Al elements may gradually decrease in a direction to the reflective electrode 16.

Hereinafter, each material forming the semiconductor light-emitting device according to an embodiment of the present inventive concept as illustrated in the figures will be described in detail. Such description may be applied to not only a configuration of FIG. 1A, but also a configuration that is indicated with the same names of the other figures.

The substrate 10 may use any material without limitation if the material is used for the growth of the nitride semiconductor material. Currently, it is difficult to use a substrate material that is exactly lattice-matched to the nitride semiconductor material. Rather, a sapphire substrate that facilitates the growth of the nitride semiconductor material relatively easily, and that has a stable characteristic at a high temperature may be used. In addition, examples of the substrate are a Si, a SiC, a $MgAl_2O_4$, a MgO, a $LiAlO_2$, a $LiGaO_2$, or a GaN substrate.

The buffer layer 11 alleviates the lattice mismatch between the nitride semiconductor material formed on the buffer layer 11 and the substrate 10, and the buffer layer 11 may be formed of; for example, AlN, GaN, or the like. The buffer layer 11 may be a superlattice structure formed of AlGaN/AlN.

The n-type nitride semiconductor layer 12 may be formed by doping an n-type dopant to a material that has a chemical formula of $Al_xIn_yGa_{(1-x-y)}N$ (wherein, $0 \le x \le 1$, $0 \le y \le 1$, $0 \le x+y \le 1$). For example, the n-type nitride semiconductor layer 12 may be formed by doping an n-type dopant such as Si, Ge, Se, Te, or C into a material such as AlGaN, GaN, or GaInN.

The active layer 13 may be formed in a multi quantum well (MQW) structure and have a multilayer structure in which quantum well layers and quantum barrier layers are alternately stacked. As the quantum well layers/quantum barrier layers of the active 13 in the light-emitting device according to an embodiment of the present inventive concept, examples of the MQW structure such as GaN/AlGaN, InAlGaN/InAlGaN, and InGaN/AlGaN may be used to emit the ultraviolet light. In order to improve light-emitting efficiency of the active layer 13, a depth of the quantum well, a number of the stacked layers of the quantum well layers/quantum barrier layers, and a thickness thereof may be changed.

The p-type nitride semiconductor layer 14 may be formed by doping a p-type dopant to a material that has a chemical formula of $Al_xIn_yGa_{(1-x-y)}N$ (wherein, $0 \le x \le 1$, $0 \le y \le 1$, $0 \le x+y \le 1$). For example, the p-type nitride semiconductor layer 14 may be formed of AlGaN by doping a p-type dopant such as Mg, Zn, or Be, wherein a representative p-type dopant is Mg.

The contact layer 15 forms an ohmic contact with the reflective electrode 16 and may be formed of GaN that includes Al elements. The composition ratio of Al elements included in the contact layer 15 may be greater than about 0% and smaller than 50%. The composition ratio of Al elements included in GaN may change depending on a thickness of the contact layer 15. The composition ratio of Al elements may be high at a region in the contact layer 15 that is adjacent to the p-type nitride semiconductor layer 14 and low at a region in the contact layer 15 that is adjacent to the reflective layer 16. For example, the composition ratio of Al elements at an interface region with the p-type nitride semiconductor layer 14 may be about 50%, and sequentially or continuously decreases toward an interface region with the reflective electrode 16. Thus, the composition ratio of Al elements of the contact layer 15 may be greater than about 0% and smaller than about 10% at the interface region with the reflective electrode 16. The region in the contact layer 15, wherein the composition ratio of Al elements decreases, may have a thickness greater than about 0 nm and smaller than about 50 nm. The contact layer 15 may be doped with the p-type dopant. For example, the contact layer 15 may have a doping concentration of the p-type dopant Mg about $10^{20}$ atom/cm$^3$ or more.

Figure 2:
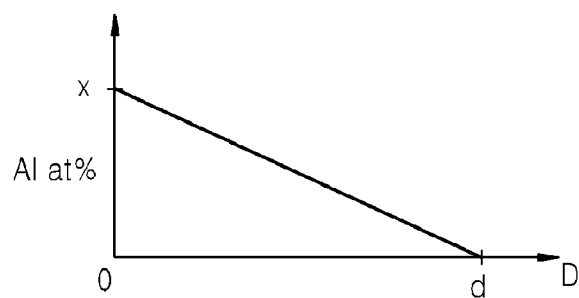
FIG. 2 is a graphical view schematically illustrating a distribution of a composition ratio of Al elements in a semiconductor light-emitting device of FIG. 1A.
Figure 3:
FIG. 3 is a view illustrating a semiconductor light-emitting device including a contact layer that includes a region formed by Al elements in a multilayer structure.

FIG. 2 is a graphical view schematically illustrating a distribution of a composition ratio of Al elements in a semiconductor light-emitting device as illustrated in FIG. 1A. Herein, the 'D' represents a distance from the p-type nitride semiconductor layer 14 to the reflective layer 16, and the 'd' represents a thickness of the contact layer 15. The 'x' represents the composition ratio of Al elements at the contact layer 15 that is adjacent to the p-type nitride semiconductor layer 14. The initial composition ratio of Al elements may be about 50% and continuously decrease toward the reflective electrode 16. As described above, the contact layer 15 may have a relatively high composition ratio of Al elements at the interface region with the p-type semiconductor layer 14 and a relatively low composition ratio of Al elements at the interface region with the reflective electrode 16. Namely, the contact layer 15 may be formed according to the gradually decreasing composition ratio of Al elements in a thickness direction. FIG. 2 illustrates the gradually decreasing composition ratio of Al elements; however, the composition ratio of Al elements may continuously or discontinuously decrease without limitation. Herein, in the contact layer 15, a region formed by Al elements is not limited, and the Al elements may be included in the contact layer 15 entirely or partially. In addition, as illustrated in FIG. 3, a region formed by Al elements may have a multilayer structure. This will be described later with reference to FIG. 3.

The contact layer 15 includes Al elements, thus a contact with the reflective electrode 16 may be facilitated, and light extraction efficiency of an ultraviolet light-emitting device may be improved.

In order to form a semiconductor light-emitting device that emits the ultraviolet light with a wavelength of about 320 nm or less, the n-type nitride semiconductor layer 12 may be formed of AlGaN in which the composition ratio of Al elements is about 50% or more, the active layer 13 may be formed of AlGaN in which the composition ratio of Al elements is about 30% or more, and the p-type nitride semiconductor layer 12 may be formed of AlGaN in which the composition ratio of Al elements is about 50% or more. Electrons supplied from the n-type nitride semiconductor layer 12 meet and recombine with holes supplied from the p-type nitride semiconductor layer 14 in the active layer 13 to emit the ultraviolet light. Herein, in order to reflect the ultraviolet light to the reflective electrode 16 wherein the ultraviolet light is emitted from the active layer 13 and has high efficiency of light extraction, the light absorption between the active layer 13 and the reflective electrode 16 needs to be minimized. In the case of AlGaN, the ultraviolet light may easily pass through the p-type nitride semiconductor layer 14 because AlGaN has a low ratio of the light absorption with respect to the light from the ultraviolet region.

However, the contact characteristics between the reflective electrode 16 and the p-type nitride semiconductor layer 14 are not good, wherein the reflective electrode 16 is for reflecting the ultraviolet light with a wavelength of about 320 nm, and the p-type nitride semiconductor layer 14 is formed of AlGaN. Therefore, the contact layer 15 may be formed on the p-type nitride semiconductor layer 14. For example, when an Al-based metal is used as the reflective electrode 16, it is not easy to form an ohmic contact due to the low work function of Al elements. However, when the contact layer 15 is formed of GaN to form the reflective electrode 16, the absorption of the ultraviolet light occurs and accordingly light extraction efficiency is greatly degraded. For example, in the case of a GaN layer with a thickness of about 100 nm or more, about 80% or more of the ultraviolet light may be absorbed. Therefore, light extraction efficiency may be improved by increasing the composition ratio of Al elements when the contact layer 15 is formed of GaN that includes Al elements and when the contact layer 15 is at the region adjacent to the p-type nitride semiconductor layer 14. In addition, the light extraction efficiency may be improved by decreasing the composition ratio of Al elements at the region adjacent to the reflective electrode 16. Accordingly, formation of the reflective electrode 16 may be facilitated as well.

The reflective electrode 16 reflects the light emitted from the active layer 13, and examples of the reflective electrode 16 are a metal or an alloy that has a high reflectivity for the ultraviolet light with a wavelength of about 320 nm or less. For example, an Al element having a high reflectivity with a wavelength range of the ultraviolet light or an Al-based metal including an alloy of Al elements may be used as the reflective electrode 16. Herein, the alloy of Al elements may be formed of an Al element and a metal having a higher work function than Al elements.

The nitride semiconductor material as described above may be deposited by a process of forming the nitride semiconductor which is widely used, but the deposition method is not limited thereto. For example, metal organic chemical vapor deposition (MOCVD), molecular beam epitaxy (MBE), or hybrid vapor phase epitaxy (HVPE) may be used. In addition, the reflective electrode 16 may be formed by physical or chemical vapor deposition but is not limited thereto.

Figure 1B:
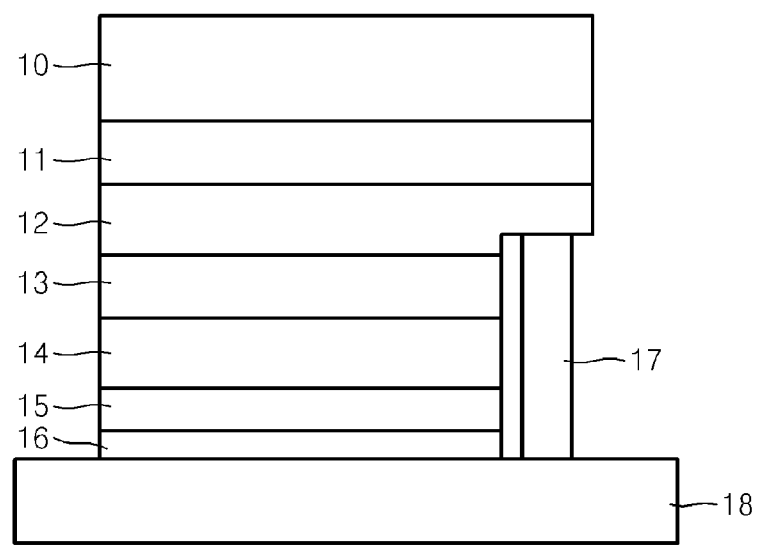
FIG. 1B is a view illustrating a flip-chip structure of a semiconductor light-emitting device including a contact layer to form a reflective electrode, according to an embodiment of the present inventive concept.

FIG. 1B is a view illustrating a flip-chip structure of a semiconductor light-emitting device to form a reflective electrode, according to an embodiment of the present inventive concept.

Referring to FIG. 1B, the semiconductor light-emitting device according to an embodiment of the present inventive concept may electrically connect the reflective electrode 16 with a submount 18, and may be formed in a flip-chip structure with a m-type metal contact 17 that electrically connects an n-type semiconductor layer 12 with the submount 18. A p-type metal contact may be further formed between the reflective electrode 16 and the submount 18. The light generated in the active layer 13 may be emitted without directivity, and the light emitted toward the reflective electrode 16 may be reflected from the reflective electrode 16 and emitted toward the substrate 10.

FIG. 3 is a view illustrating a semiconductor light-emitting device including a contact layer that includes a region formed of Al elements in a multilayer structure.

Referring to FIG. 3, the semiconductor light-emitting device according to an embodiment of the present inventive concept may include a substrate 30, a buffer layer 31 formed on the substrate 30, and a multilayer of an n-type nitride semiconductor layer 32, an active layer 33 and a p-type nitride semiconductor layer 34 that are sequentially formed on the buffer layer 31. In addition, a contact layer 35 with a region including Al elements may be formed on the p-type nitride semiconductor layer 34, and a reflective layer 36 may be formed thereon. Regions 35a and 35c that include Al elements in the contact layer 35 may be formed in a discontinuous multilayer structure. The contact layer 35 may include a first region 35a that includes Al elements, a region 35b that does not include Al elements, and a second region 35c that includes Al elements. In this manner, a region including Al elements may be further formed. When the regions 35a and 35c that include Al elements are formed in plurality, the region 35b that does not include Al elements may be formed at least one layer. Herein, a total thickness of the region that does not include Al elements may be about 50 nm or less.

Figure 4:
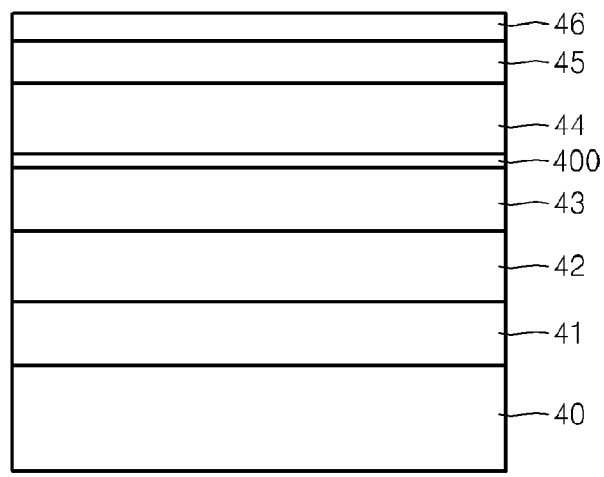
FIG. 4 is a view illustrating a semiconductor light-emitting device further including an electronic blocking layer, according to an embodiment of the present inventive concept.

FIG. 4 is a view illustrating a semiconductor light-emitting device further including an electronic blocking layer, according to an embodiment of the present invention.

Referring to FIG. 4, the semiconductor light-emitting device according to an embodiment of the present inventive concept may include a substrate 40, a buffer layer 41 formed on the substrate 40, and a multilayer of an n-type nitride semiconductor layer 42 and an active layer 43 that are formed on the buffer layer 41. An electron blocking layer (EBL) 400 may be formed on the active layer 43, and a p-type nitride semiconductor layer 44, a contact layer 45 with a region including Al elements, and a reflective electrode 46 may be formed on the EBL 400. The EBL 400 prevents the electrons provided from the n-type nitride semiconductor layer 42 from overflowing instead of failing to recombine with the holes in the active layer 43. Herein, the composition ratio of Al elements may be from about 40% to about 100%.

Figure 5:
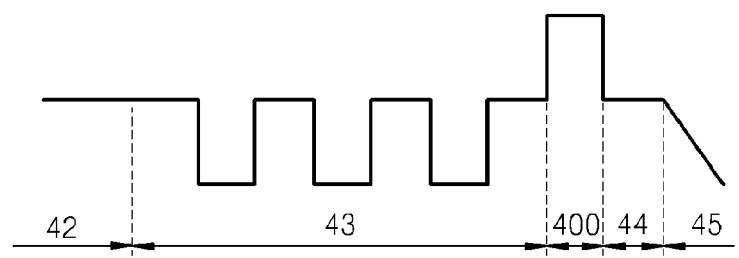
FIG. 5 is a view schematically illustrating an energy level of each layer of a semiconductor light-emitting device of FIG. 4.

FIG. 5 is a view schematically illustrating an energy level of each layer of a semiconductor light-emitting device as illustrated in FIG. 4.

Referring to FIG. 5, due to the MQW structure, the active layer 43 has a high energy level in the quantum barrier layer region that includes Al elements, and a low energy level in the quantum well region that does not include Al elements. The EBL 400 that has a relatively high composition ratio of Al elements has a high energy level, thus the overflowing electrons from the active layer 43 may be blocked. In addition, the contact layer has a high composition ratio of Al elements at the region adjacent to a p-type nitride semiconductor layer 44, thus accordingly maintains a high energy level. However, as the composition ratio of Al elements gradually decreases, the energy level decreases.

As described above, according to the one or more embodiments of the present inventive concept, the semiconductor light-emitting device includes Al elements in the contact layer, thus efficiency of light extraction of the light emitted from the active layer may be improved, and the contact with the reflective electrode may be improved as well.

While the present disclosure has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor light-emitting device comprising:
an n-type nitride semiconductor layer;
an active layer disposed on the n-type nitride semiconductor layer;
a p-type nitride semiconductor layer disposed on the active layer;
a contact layer that is disposed on the p-type nitride semiconductor layer and has a composition ratio of aluminum (Al) elements that is variable along a thickness direction; and
a reflective electrode disposed on the contact layer,
wherein the contact layer comprises first, second, and third regions that are sequentially disposed along the thickness direction from the p-type nitride semiconductor layer to the reflective electrode, and wherein the first and third regions include Al elements and the second region does not include Al elements.

2. The semiconductor light-emitting device of claim 1, wherein a thickness of the contact layer, of which the composition ratio of Al elements is variable along the thickness direction, is greater than about 0 nm and smaller than about 50 nm.

3. The semiconductor light-emitting device of claim 1, wherein the contact layer comprises a relatively high composition ratio of Al elements at an interface region with the p-type nitride semiconductor layer, and a relatively low composition ratio of Al elements at an interface region with the reflective electrode.

4. The semiconductor light-emitting device of claim 1, wherein the contact layer has the composition ratio of Al elements that continuously or discontinuously varies.

5. The semiconductor light-emitting device of claim 1, wherein the first region of the contact layer has the composition ratio of Al elements that is greater than about 0% and smaller than about 50%.

6. The semiconductor light-emitting device of claim 1, wherein the contact layer comprises the first region formed of Al elements in a multilayer structure.

7. The semiconductor light emitting device of claim 1, wherein the second region of the contact layer that does not include Al elements has a total thickness of about 50 nm or less.

8. The semiconductor light-emitting device of claim 1, wherein the reflective electrode is formed of an Al-based material.

9. The semiconductor light-emitting device of claim 8, wherein the Al-based material comprises an Al element or an alloy thereof.

10. The semiconductor light-emitting device of claim 9, wherein the alloy of Al elements comprises an Al element and a metal having a higher work function than that of Al elements.

11. The semiconductor light-emitting device of claim 1, further comprising an electron blocking layer that is disposed between the active layer and the p-type semiconductor layer.

12. The semiconductor light-emitting device of claim 11, wherein the electron blocking layer formed of AlGaN has the composition ratio of Al elements in a range of about 40% to about 100%.

13. The semiconductor light-emitting device of claim 1, wherein the semiconductor light-emitting device is an ultraviolet light-emitting device.

14. The semiconductor light-emitting device of claim 1, wherein the semiconductor light-emitting device is a flip-chip-type semiconductor light-emitting device.

15. A semiconductor light-emitting device comprising:
an n-type nitride semiconductor layer;
an active layer disposed on the n-type nitride semiconductor layer;
a p-type nitride semiconductor layer disposed on the active layer;
a contact layer that is disposed on the p-type nitride semiconductor layer and has a composition ratio of aluminum (Al) elements that is variable along a thickness direction;
a reflective electrode disposed on the contact layer;
a submount disposed on the reflective electrode; and
a metal contact which connects the n-type nitride semiconductor layer with the submount,
wherein the contact layer comprises first, second, and third regions that are sequentially disposed along the thickness direction from the p-type nitride semiconductor layer to the reflective electrode, and wherein the first and third regions include Al elements and the second region does not include Al elements.

16. The semiconductor light-emitting device of claim 15, wherein the contact layer comprises a relatively high composition ratio of Al elements at an interface region with the p-type nitride semiconductor layer, and a relatively low composition ratio of Al elements at an interface region with the reflective electrode.

17. The semiconductor light-emitting device of claim 15, wherein the metal contact extends in parallel with the side surfaces of the active layer, the p-type nitride semiconductor layer, the contact layer, and reflective electrode.

18. The semiconductor light-emitting device of claim 15, wherein the first region of the contact layer has the composition ratio of Al elements that is greater than about 0% and smaller than about 50%.

19. The semiconductor light-emitting device of claim 15, wherein the contact layer comprises the first region formed of Al elements in a multilayer structure.

* * * * *